(12) United States Patent
Yamamoto et al.

(10) Patent No.: US 8,823,033 B2
(45) Date of Patent: Sep. 2, 2014

(54) NITRIDE SEMICONDUCTOR ULTRAVIOLET LIGHT-EMITTING DEVICE

(71) Applicants: Shuichiro Yamamoto, Osaka (JP); Shuichi Hirukawa, Osaka (JP); Masataka Ohta, Osaka (JP)

(72) Inventors: Shuichiro Yamamoto, Osaka (JP); Shuichi Hirukawa, Osaka (JP); Masataka Ohta, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/688,335

(22) Filed: Nov. 29, 2012

(65) Prior Publication Data
US 2013/0146916 A1 Jun. 13, 2013

(30) Foreign Application Priority Data
Dec. 7, 2011 (JP) ................................. 2011-267762

(51) Int. Cl.
*H01L 33/00* (2010.01)
(52) U.S. Cl.
USPC .............. 257/98; 257/E33.025; 257/E33.028
(58) Field of Classification Search
CPC ....................................................... H01L 33/42
USPC .......................... 257/98, E33.025, E33.028
See application file for complete search history.

(56) References Cited

U.S. PATENT DOCUMENTS

| 7,180,094 | B2 * | 2/2007 | Seong et al. ..................... 257/59 |
| 7,906,791 | B2 * | 3/2011 | Nakahara ......................... 257/98 |
| 2007/0158661 | A1 * | 7/2007 | Lu et al. ............................ 257/79 |
| 2012/0213242 | A1 * | 8/2012 | Tanaka et al. ................ 372/50.1 |
| 2013/0016751 | A1 * | 1/2013 | Takado et al. ............ 372/45.012 |

FOREIGN PATENT DOCUMENTS

| JP | 2006278554 A | 10/2006 |
| JP | 2008053425 A | 3/2008 |
| JP | 2011060917 A | 3/2011 |
| JP | 2011151393 A | 8/2011 |

\* cited by examiner

*Primary Examiner* — Trung Q Dang
(74) *Attorney, Agent, or Firm* — Harness, Dickey & Pierce, P.L.C.

(57) ABSTRACT

A nitride semiconductor ultraviolet light-emitting device includes at least one first conductivity-type nitride semiconductor layer, a nitride semiconductor emission layer, at least one second conductivity-type nitride semiconductor layer and a transparent conductive film of crystallized $Mg_{x1}Zn_{1-x1}O$ ($0<x1<1$) that can transmit 75% or more of light emitted from the emission layer, sequentially stacked in this order on a support substrate.

10 Claims, 5 Drawing Sheets

NITRIDE SEMICONDUCTOR ULTRAVIOLET LIGHT-EMITTING DEVICE

This nonprovisional application is based on Japanese Patent Application No. 2011-267762 filed on Dec. 7, 2011 with the Japan Patent Office, the entire contents of which are hereby incorporated by reference.

BACKGROUND OF THE INVENTION

1. Field of the Invention

This invention is related to a nitride semiconductor ultraviolet light-emitting device having high emission intensity.

2. Description of the Background Art

Nitride semiconductors such as AlGaN, GaN and InGaN are compound semiconductors that can emit light in a range from an ultraviolet region to an infrared region. In recent years, white LEDs (light-emitting diodes) are practically used for mobile phones and for backlight sources of liquid crystal televisions, and applications thereof are also growing for general illumination sources in place of incandescent lamps and fluorescent lamps. A white LED can be obtained by combining a fluorescence substance and a blue light-emitting diode formed with nitride semiconductor such as InGaN having an emission wavelength around 460 nm.

In a shorter emission wavelength range, there is also practically available a light-emitting diode including an active layer (emission layer) of InGaN-based nitride semiconductor having an emission wavelength in a range from ultraviolet longer than 365 nm to purple. However an ultraviolet light-emitting diode including an emission layer containing Al and having an emission wavelength shorter than 365 nm is still in research and development phases.

The AlGaN semiconductor is able to emit light in a range from ultraviolet of 365 nm wavelength to deep ultraviolet of 210 nm wavelength with adjustment of its Al composition ratio. Therefore it is hoped to use ultraviolet light-emitting diodes in place of the conventional ultraviolet lamps and conventional ultraviolet light sources and also hoped to apply them to the technical fields of sterilization, resin curing, medical treatment, etc. and thus research and development thereof are actively carried out at the present time.

In the meantime, in order to make shorter the emission wavelength of the ultraviolet light-emitting diode including the AlGaN emission layer, it is necessary to increase the Al composition ratio of the emission layer. Further, in order to suppress absorption of ultraviolet light in the semiconductor layers constituting the light-emitting diode, it is necessary to increase the Al composition ratios of the AlGaN layers in the n-type and p-type layer regions as compared to the emission layer. However in the case of increasing the Al composition ratio, not only the p-type layer but also the n-type layer becomes highly-resistive. As a result, electric current diffusion becomes insufficient in the semiconductor layers of the p-type and the n-type, and then the concentration of carriers injected into the emission layer becomes non-uniform whereby causing deterioration of the emission efficiency.

Further, since sapphire generally used as a substrate of the light-emitting device has low heat conductivity, there is a possibility that the temperature of the device increases due to insufficient heat dissipation during a high temperature operation or a high output operation of the device thereby causing saturation of the emission power or breakdown of the device.

Blue light-emitting diodes usually have their device structure of the lateral-type structure. More specifically, in the blue light-emitting device, the n-type semiconductor layer is partly exposed by dry etching, the n-type electrode is formed on the exposed part, and the transparent electrode of ITO (indium tin oxide) is fanned on the remaining p-type semiconductor layer part, so as to improve the efficiency of taking out light from the device. In general, even in the case of the blue light-emitting diode having the lateral-type structure, the n-type semiconductor layer has relatively low resistivity. Therefore if the contact electrode is formed in a wide area on the p-type semiconductor layer, electric current is sufficiently diffused in the p-type layer and uniformly injected into the emission layer whereby it is possible to obtain uniform light emission. However as a heat dissipation measure in the case of a high output LED and a large size LED requiring more uniform current injection or an LED required to operate at a high temperature, there is a case that the sapphire substrate for growth of the semiconductor layers is removed by laser lift-off and replaced with a conductive support substrate having high heat conductivity by a bonding method or the like so as to form the vertical-type structure and improve the properties of current diffusion, heat dissipation and the like.

In Patent Document 1 of Japanese Patent Laying-Open No. 2008-53425 and Patent Document 2 of Japanese Patent Laying-Open No. 2011-151393, in order to further improve the optical output of the vertical-type device in which the substrate is removed, there are disclosed a technique to provide a reflective electrode and a technique to provide a transparent electrode such as of ITO formed on the n-type electrode side where the substrate has been removed. Patent Document 3 of Japanese Patent Laying-Open No. 2006-278554 also discloses a technique to provide a transparent electrode of ITO in an ultraviolet LED having a peak emission wavelength around 330 nm. Further, Patent Document 4 of Japanese Patent Laying-Open No. 2011-60917 describes that it is possible in a visible light LED to use Ga-doped MgZnO or Al-doped MgZnO for the transparent electrode formed on the p-layer side.

However it is not possible to directly apply the techniques of the blue light-emitting diodes as disclosed in Patent Documents 1-4 to the ultraviolet light-emitting device. While ITO is generally used for the transparent conductive film or transparent electrode in the blue light-emitting diode, ITO is not suitable for the transparent electrode material in the ultraviolet light-emitting device because the light absorption thereof becomes significant in the ultraviolet region. According to Patent Document 3, the transmittance of ITO is less than 70% for light of wavelength less than 320 nm, and thus it is not possible to use ITO as the transparent electrode for light of wavelength less than 320 nm. Further, even in the case that the ultraviolet light-emitting device is formed with the vertical-type simply having the flip-chip structure as disclosed in Patent Document 2, since both the layers of the p-type and the n-type are highly-resistive and electric current does not sufficiently diffuse, light emission is caused only in the vicinity of the electrode and then the emission efficiency cannot be improved. In order to diffuse the electric current, therefore, it becomes necessary that both the electrodes for the p-type and the n-type are formed as electrodes of wide areas covering almost the entire area from which light is taken out. Then, in order to efficiently take out light from the light-emitting device, it becomes necessary that at least one side electrode is made transparent for the emitted light.

The Ga-doped MgZnO or the Al-doped MgZnO for the transparent electrode in the visible-light LED as disclosed in Patent Document 4 has not sufficient conductivity and does not sufficiently function as the transparent electrode for the ultraviolet light-emitting device including the highly-resistive semiconductor layers. The reason for this is that since MgO is an insulator, MgZnO that is a compound thereof with ZnO is also highly-resistive and does not has such carrier mobility that generally enables it to function as the transparent conductive film.

As explained in the above, in the present circumstances, no electrode material has been found, which can sufficiently function as the transparent electrode for the nitride ultraviolet light-emitting device.

SUMMARY OF THE INVENTION

An object of the present invention is to solve the above-described problems in the nitride semiconductor ultraviolet light-emitting device and provide a nitride semiconductor ultraviolet light-emitting device having improved emission intensity.

A nitride semiconductor ultraviolet light-emitting device according to the present invention includes at least one first conductivity-type nitride semiconductor layer, a nitride semiconductor emission layer, at least one second conductivity-type nitride semiconductor layer and a transparent conductive film of crystallized $Mg_{x1}Zn_{1-x1}O$ ($0<x1<1$) that can transmit 75% or more of light emitted from the emission layer, sequentially stacked in this order on a support substrate.

Incidentally it is preferable that the transparent conductive film includes polycrystalline $Mg_{x1}Zn_{1-x1}O$ oriented along its c-axis and it is more preferable that the transparent conductive film includes monocrystalline $Mg_{x1}Zn_{1-x1}O$ and it is further preferable that the transparent conductive film of monocrystalline $Mg_{x1}Zn_{1-x1}O$ is lattice-matched with the second conductivity-type nitride semiconductor layer.

The transparent conductive film may be non-doped or may be added with at least one kind of elements of Al, Ga and In as impurities.

The first conductivity-type and the second conductivity-type layers may be a p-type and an n-type respectively and are preferably formed with p-type $Al_{x2}Ga_{1-x2-y2}In_{y2}N$ ($0 \leq x2 \leq 1$, $0 \leq y2 \leq 1$, $0 \leq x2+y2 \leq 1$) and n-type $Al_{x3}Ga_{1-x3-y3}In_{y3}N$ ($0 \leq x3 \leq 1$, $0 \leq y3 \leq 1$, $0 \leq x3+y3 \leq 1$), respectively.

The emission layer preferably has an emission wavelength in a range of 215 nm to 365 nm and preferably includes $Al_{x4}Ga_{1-x4-y4}In_{y4}N$ ($0 \leq x4 \leq 1$, $0 \leq y4 \leq 1$, $0 \leq x4+y4 \leq 1$). Further, it is preferable that the support substrate and the first conductivity nitride semiconductor layer are electrically connected to each other with a highly-reflective film intervening therebetween which can reflect 75% or more of light having a wavelength emitted from the emission layer.

In the nitride semiconductor ultraviolet light-emitting device according to the present invention, since the crystallized MgZnO capable of transmitting the emission wavelength is used as the transparent conductive film, it is possible to increase the optical output of the device.

Further, in the nitride semiconductor ultraviolet light-emitting device according to the present invention, since the crystallized MgZnO having high mobility of carriers is used as the transparent conductive film, electric current is diffused in the transparent conductive film and uniformly injected into the emission layer, thereby making it possible to realize the uniform light emission from the emission layer and the increase of the optical output.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Formation of a nitride semiconductor ultraviolet light-emitting device according to an embodiment of the present invention is described in the following.

(Epitaxial Growth of Nitride Semiconductor Layers)

In formation of a nitride semiconductor ultraviolet light-emitting device according to an embodiment of the present invention, a plurality of nitride semiconductor layers can be epitaxially crystal-grown on a sapphire substrate by properly using a well-known crystal growth technique such as an MOCVD (metal organic chemical vapor deposition) method, an MBE (molecular beam epitaxy) method, or the like. As a substrate for the crystal growth it is also possible to use a substrate of SiC, GaN, AlN, or the like, other than sapphire.

Figure 1:
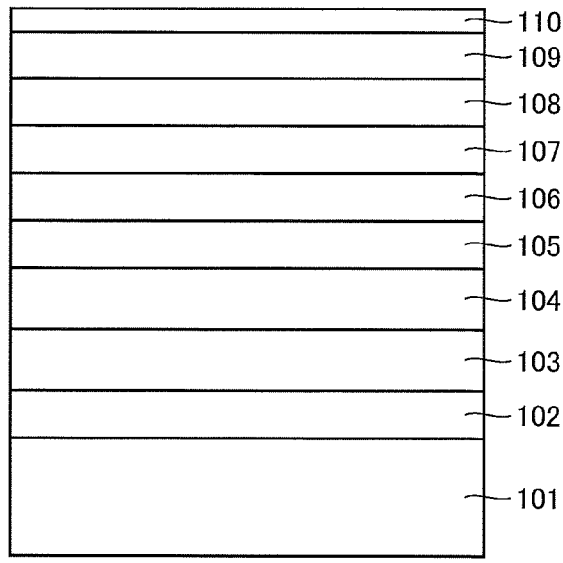
FIG. 1 is a schematic cross-sectional view of a stacked-layer structure including a sapphire substrate after epitaxial growth of a plurality of nitride semiconductor layers according to an embodiment of the present invention.

For a more specific example as shown in FIG. 1, after a wafer of a sapphire substrate has been introduced in an MOCVD apparatus, an AlN buffer layer 102 of a thickness of 5-500 nm (15 nm for example), an AlN layer 103 of a thickness of 0.1-4 μm (0.5 μm for example), an $Al_{0.45}Ga_{0.55}N$ underlayer 104 of a thickness of 0.05-0.5 μm (0.06 μm for example), a substrate-removing layer 105 formed with an $Al_{0.22}Ga_{0.78}N$/AlN superlattice layer 105, an n-type $Al_{0.45}Ga_{0.55}N$ contact layer 106 of a thickness of 0.5-4 μM (2 μm for example), an emission layer 107 formed with AlGaN/AlGaN, a p-type $Al_{0.85}Ga_{0.15}N$ block layer 108 of a thickness of 5-300 nm (15 nm for example), a p-type $Al_{0.45}Ga_{0.55}N$ layer 109 of a thickness of 50-1000 nm (150 nm for example), and a p-type GaN contact layer 110 of a thickness of 20-500 nm (50 nm for example) stacked in this order on a sapphire substrate 101.

(Heat Treatment for Activating P-Type Layers)

After completion of the crystal growth in the MOCVD apparatus, the wafer including the stacked nitride semiconductor layers is taken out from the MOCVD apparatus and subjected to a heat treatment for activating the p-type layers. Specifically, the wafer is introduced into a heat treatment apparatus and heat-treated at a high temperature of 650-1000°

C. (900° C. for example) for 1-10 minutes (5 minutes for example). As an atmosphere for the heat treatment, it is possible to use a nitrogen atmosphere, a mixed atmosphere of nitrogen/oxygen containing nitrogen and 0.1-100% oxygen (3% for example), or a pure oxygen atmosphere. With this heat treatment, activation of the p-type layers is enhanced and resistivity of the p-type layers is reduced. The reason for this reduction of the resistivity is that hydrogen atoms bonded with magnesium atoms introduced as impurities into the p-type layers are separated away as a result of the heat treatment, and then the magnesium atoms are activated as acceptors.

(Formation of Mirror Electrode)

Figure 2:
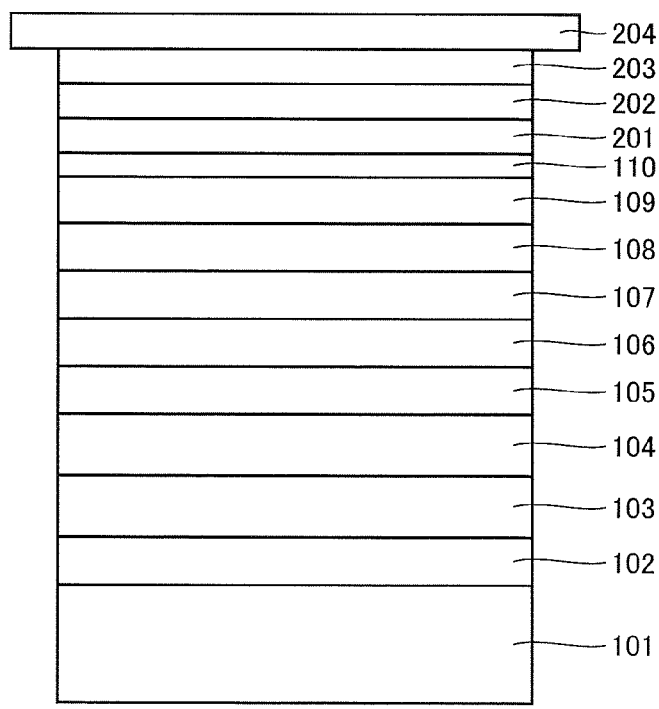
FIG. 2 is a schematic cross-sectional view of a stacked-layer structure in which electrode layers and a support substrate are further stacked on the stacked-layer structure of FIG. 1.

After completion of the heat treatment for activating the p-type layers, a contact electrode and a reflective electrode are formed as shown in FIG. 2. More specifically, the heat-treated wafer is introduced into a vacuum evaporation apparatus, and a contact electrode 201 of a thin Pd film is formed on p-type GaN contact layer 110. Here, in order to suppress light absorption due to the Pd electrode layer, the transmittance thereof is necessarily 75% or more and preferably 95% or more. Therefore Pd electrode 201 desirably has a thickness of 0.5-15 nm (2.5 nm for example).

A mirror electrode 202 for reflecting light emitted from emission layer 107 is formed on Pd contact electrode layer 201. The reflectance of this mirror electrode layer is preferably 75% or more, and more preferably 90% or more. Then, ultraviolet light propagating from the emission layer to the p-type layer side is reflected to the sapphire substrate side by mirror electrode layer 202, whereby making it possible to improve the efficiency of taking out light from the light-emitting device.

As a material for mirror electrode layer 201, a thick metal film such as of Al, Ag or the like is preferable. For example, Al mirror electrode layer 202 may be deposited subsequently to deposition of Pd contact electrode layer 201 in the evaporation apparatus. While this Al mirror electrode layer preferably has a thickness of 100-1000 nm (500 nm for example), the thickness is not restrictive as long as it can realize the function of a mirror having a reflectance of 75% or more for light emitted from emission layer 107. In the case that metallic mirror electrode layer 202 is too thin, it cannot sufficiently function as a mirror because light transmits therethrough. While metallic mirror electrode layer 202 functions as a mirror for reflecting ultraviolet light, it also functions as a part of the p-side electrode after it is connected to a conductive support substrate 204 with a conductive adhesive agent 203 intervening therebetween.

(Connection of Electrode Layer to Support Substrate)

As shown in FIG. 2, Al mirror electrode layer 202 is adhered on support substrate 204 of Cu—W (copper-tungsten) for example. At this time, Al mirror electrode layer 202 and support electrode 204 can be bonded by adhesion layer 203 such as of a conductive polyimide resin containing Ag particles for example. It is desirable that the resin included in adhesion layer 203 does not cause decomposition or change of properties with ultraviolet light of 215-365 nm wavelength emitted from emission layer 107, and it is necessary to select an optimum resin as desired.

(Removal of Sapphire Substrate)

After Al mirror electrode 202 has been bonded to Cu—W support substrate 204 by conductive adhesion layer 203, sapphire substrate 101 is removed. This removal of the sapphire substrate can be carried out by using a laser lift-off method. As shown by arrow marks in FIG. 3 for example, laser rays of 266 nm wavelength are directed into the wafer from the sapphire substrate side. The laser rays are absorbed in $Al_{0.22}Ga_{0.78}N$/AlN superlattice layer 105, because the $Al_{0.22}Ga_{0.78}N$ layer included in superlattice layer 105 has its absorption function in the vicinity of wavelength of 266 nm. Energy of the laser rays is absorbed in superlattice layer 105 and converted into heat energy, whereby the superlattice layer is decomposed by the heat, and then a part from sapphire substrate 101 to AlGaN layer 104 and the other part from n-type AlGaN contact layer 106 to Cu—W support substrate 204 can be separated from each other.

Here in the case that the emission wavelength of emission layer 107 is longer as compared with that of the irradiation laser rays at the time of removing sapphire substrate 101, i.e., in the case that absorption of the irradiation laser rays occurs in active layer 107, there is a possibility that the active layer is damaged. Therefore it is necessary to carefully adjust the wavelength and intensity of the irradiation laser rays so as that most of the irradiation laser rays are absorbed in superlattice layer 105.

Incidentally, it is also possible for removal of sapphire substrate 101 to form substrate-removing layer 105 with AlN and use irradiation laser rays of 193 nm wavelength. Other than this, it is further possible to use a set of substrate-removing layer 105 and laser rays of a wavelength having energy corresponding to the energy gap thereof.

(Formation of N-Side Transparent Conductive Film)

Figure 4:
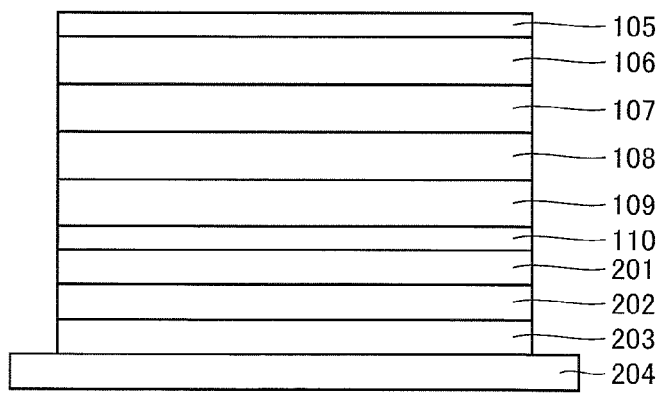
FIG. 4 is a schematic cross-sectional view of a stacked-layer structure after the sapphire substrate and the some other layers have been removed from the stacked-layer structure of FIG. 2 by the laser.

A wafer having a stacked-layer structure as shown in FIG. 4 can be obtained by such removal of the sapphire substrate as described above. Residual substances originated from AlGaN/AlN superlattice layer 105 decomposed by the laser irradiation adhere to the separation surface where the sapphire substrate has been removed by the laser irradiation. Therefore it is preferable to clean the separation surface by wet etching with an acid such as hydrochloric acid and further perforin dry etching so as to expose a clean surface of n-type AlGaN contact layer 106. For example, after the wafer has been immersed for 3 minutes in a hydrochloric acid solution, the wafer is then introduced into an RIE (reactive ion etching) apparatus so as to be dry-etched by a thickness of about 0.5 µm. After this dry etching, a resist pattern for forming a texture structure on the surface of n-type AlGaN contact layer 106 is formed by using photolithography. An example of the texture structure thus formed is shown in the schematic perspective view of FIG. 5.

Figure 5:
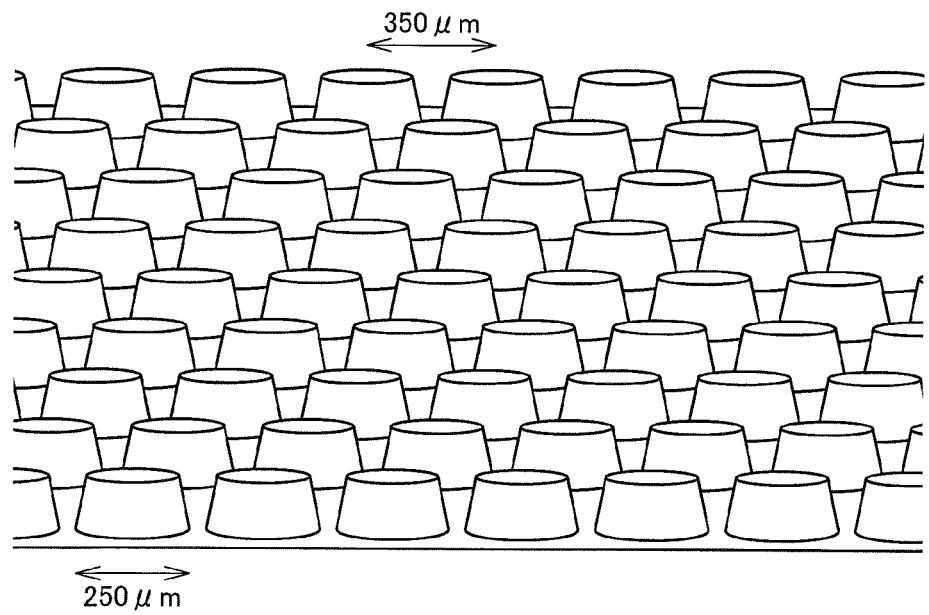
FIG. 5 is a perspective view showing a texture structure of a semiconductor layer according to an embodiment of the present invention.
Figure 6:
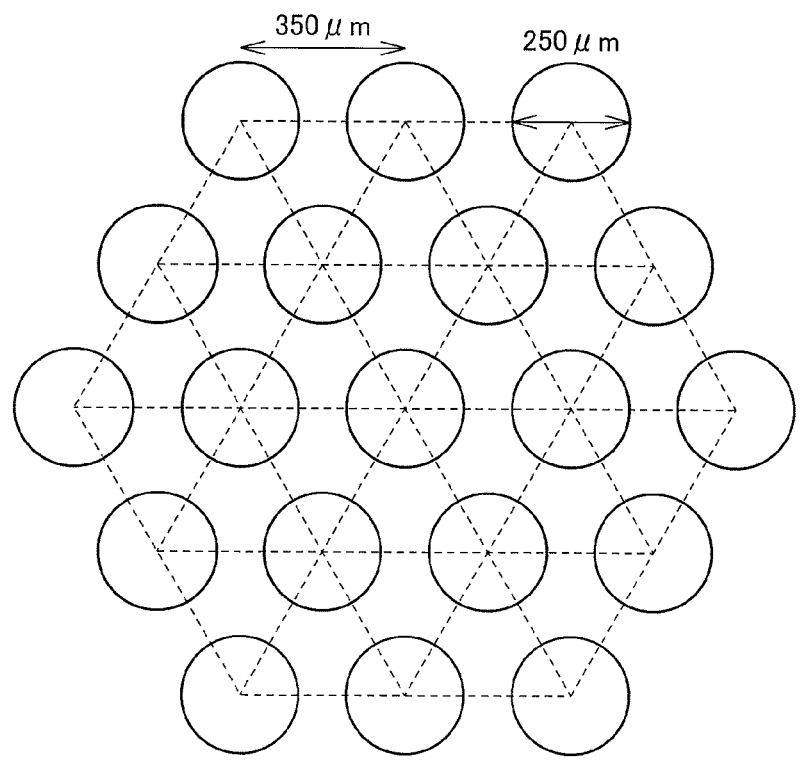
FIG. 6 is a plan view of the texture structure of FIG. 5.

Truncated-cone-shaped projections included in the texture structure shown in FIG. 5 can each have a bottom surface of 250 µm diameter, a top surface of 225 µm diameter and a height of 0.25 µm for example and can be arranged such that the centers of the truncated cones are periodically positioned at apexes of regular triangles each having a lateral of 350 µm as shown in FIG. 6. While it is not necessarily required to form the texture structure as this, it is possible by forming the texture to improve the efficiency of taking out light from n-type AlGaN contact layer 106. Further, other than the texture structure, it is also possible to form a low-reflectance structure such as the moth eye structure on the surface of n-type AlGaN contact layer 106.

Figure 7:
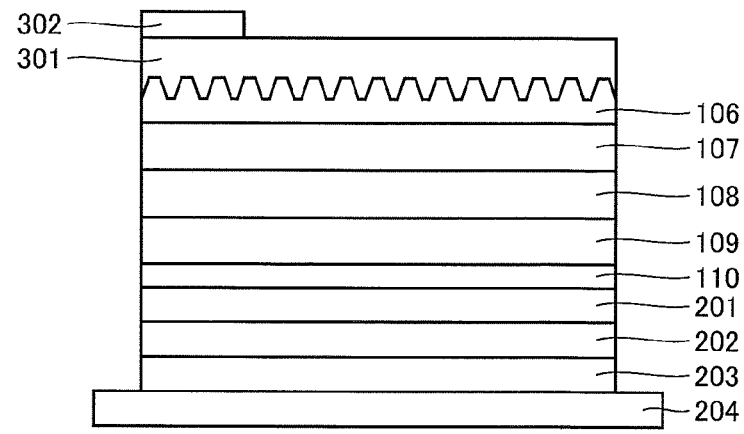
FIG. 7 is a schematic cross-sectional view of a nitride semiconductor ultraviolet light-emitting device of a vertical-type structure according to an embodiment of the present invention.

After the texture processing on the surface of n-type AlGaN contact layer 106, a transparent electrode layer 301 is deposited as shown in FIG. 7 by using an ECR (electron cyclotron resonance) sputtering apparatus. Specifically, the wafer with the formed texture structure is introduced into the ECR sputtering apparatus, a surface oxidization treatment of n-type AlGaN contact layer 106 is carried out in oxygen plasma, and consequently transparent conductive film 301 of MgZnO is deposited on the oxidization-treated surface in oxygen plasma. In the sputtering apparatus, it is possible to use either an MgZn alloy target in which the composition ratios of Mg and Zn are adjusted in advance or an MgZnO target having its adjusted composition ratios. In either of the cases, however, it is necessary to control the pressure during sputtering in the film deposition chamber so as not to cause oxygen deficiency in the MgZnO film.

In connection with the composition ratios of Mg and Zn, the band gap energy of $Mg_xZn_{1-x}O$ can be expressed by the following formula (1).

$$E=3.28(1-x)+7.80x-3.47x(1-x) \quad \text{(formula 1)}$$

Therefore in order that MgZnO conductive film 301 is transparent for light emitted from emission layer 107, it is necessary to select a composition ratio x of Mg that satisfies the band gap energy E making the film transparent with respect to the energy of light emitted from the emission layer. Further, in order that the MgZnO film functions as a transparent conductive film, it is required to have a high electron mobility and generally required to have an electron mobility as high as 100 $cm^2/V \times s$.

Since the MgZnO film deposited by the sputtering method is in an amorphous state, its electron mobility is significantly low as compared to the case of a monocrystal or the like. The amorphous MgZnO film deposited by the ECR sputtering method had a mobility of 10 $cm^2/V \times s$ or less. The MgZnO film having such a mobility is insufficient to be used as a conductive film. Therefore it is necessary to crystallize the amorphous MgZnO film deposited by sputtering and improve the electron mobility of the MgZnO film. It is effective for improving the mobility of the MgZnO film to dope in advance the sputtering target with elements such as Al, Ga and In at about $10^{20}/cm^2$.

Incidentally, in the present specification, the crystallized MgZnO means a state in which a plurality of random diffraction peaks from MgZnO in a X-ray diffraction measurement can be observed, the MgZnO film oriented along the c-axis means a state in which the diffraction peaks are observed indicating the C-plane of the MgZnO film being parallel to the C-plane of the nitride semiconductor layers, and the monocrystalline MgZnO film means a state in which the diffraction peaks are observed indicating the C-plane of the MgZnO film being parallel to the C-plane of the nitride semiconductor layers and also the diffraction peaks from the six symmetric crystalline planes can be independently observed by asymmetric measurements. By the way, the amorphous MgZnO means a state in which no diffraction peak from MgZnO is observed, or no clear diffraction peak is observed and the peaks are very broad.

The amorphous MgZnO film deposited by sputtering is heat-treated for crystallization thereof. Specifically, the wafer having amorphous MgZnO film 301 deposited thereon is introduced into the heat treatment apparatus and heat-treated for 15 minutes at 450° C. in a mixed gas atmosphere of 30% oxygen and 70% nitrogen, for example. With this heat treatment, the amorphous MgZnO film is crystallized and the crystal grains can be aligned along their c-axis orientation. As a result, the electron mobility is significantly improved particularly along the c-axis direction in the crystallized MgZnO layer. Therefore when the light-emitting device structure is formed as a vertical type, i.e., a structure in which electric current flows in the c-axis direction, the device properties can be significantly improved. It is possible to confirm the fact that the MgZnO film is oriented along the c-axis, by carrying out X-ray diffraction measurements regarding crystal planes such as (0002) planes perpendicular to the c-axis of the MgZnO crystal.

According to actual measurements of the electron mobility in the MgZnO film after the heat treatment as described above, the mobility was 95 $cm^2/V \times s$ in the case of being non-doped with impurities and 125 $cm^2/V \times s$ in the case of being doped.

By the way, the MgZnO film can also be deposited by a PLD (pulse laser deposition) method, a CVD (chemical vapor deposition) method, an MOCVD method, an MBE method, and the like, other than the sputtering method. In other words, even in the case of using the PLD method, it is also possible to obtain a good polycrystalline MgZnO film oriented along the c-axis. In the case of using the MBE method or the MOCVD method, it is possible to obtain a monocrystalline MgZnO film. As compared with the amorphous MgZnO film or the MgZnO film oriented along the c-axis, the monocrystalline MgZnO film can achieve a higher electron mobility and can significantly improve the properties of transparent conductive film 301. Further, in the case of using the MBE method or the MOCVD method, the lattice of MgZnO film 301 can be matched to that of the underlying n-type AlGaN layer 106 by strictly controlling the composition ratios of MgZnO. In this case, the light absorption due to the crystal defects are reduced and the transmittance is improved significantly, and then the high carrier mobility and high transmittance necessary as the properties of the transparent conductive film can be achieved simultaneously.

However since the MgO crystal has a rock salt structure and the ZnO crystal has a wurtzite structure, the phase separation of MgZnO is caused as increase of the Mg composition ratio and then the crystallinity of the MgZnO layer is significantly deteriorated. In the case of forming the nonocrystalline MgZnO layer, therefore, it is desirable that the composition ratio of Mg is 0.75 or less. In the meantime, according to calculation using x=0.75 in formula (1), the energy band gap E becomes 6.02 eV, and the light wavelength having an amount of energy corresponding to this energy gap is 206 μm. Therefore when the Mg composition ratio is 0.75 or less, it is possible to form the MgZnO layer that is transparent over an emission wavelength range of 215-365 nm emitted from emission layer 107.

(Formation of N-Side Pad Electrode)

After a resist pattern for forming the n-side pad electrode has been formed by using photolithography, the wafer is introduced into the evaporation apparatus, and the n-side pad electrode layer of a Ti/Al/Ti/Au stacked-layer is formed by evaporation. After the pad electrode layer has thus been formed, the wafer is taken out from the evaporation apparatus, and n-side pad electrode 302 is formed by performing a lift-off treatment on the pad electrode layer.

(Mounting)

After the formation of n-side pad electrode 302 has been finished, the wafer is divided by dicing into a plurality of chips of an appropriate size (1 mm×1 mm for example). Each ultraviolet LED chip obtained by the chip division is mounted on a stem where wiring is carried out on the n-side pad electrode etc. and then it is sealed with an ultraviolet-transmittable resin or the like to obtain an ultraviolet LED device.

Example 1

As shown in FIG. 1, an AlN buffer layer 102 of 15 nm thickness, an AlN layer 103 of 0.5 μm thickness, an $Al_{0.44}Ga_{0.56}N$ underlayer 104 of 0.06 μm thickness, a substrate-removing layer 105 formed with an $Al_{0.22}Ga_{0.78}N$/AlN superlattice layer, an n-type $Al_{0.45}Ga_{0.55}N$ contact layer 106 of 2 μm thickness, an emission layer 107 formed with AlGaN/AlGaN, a p-type $Al_{0.85}Ga_{0.15}N$ block layer 108 of 15 nm thickness, a p-type $Al_{0.45}Ga_{0.55}N$ layer 109 of 150 μm thickness, and a p-type GaN contact layer 110 of 50 nm thickness were stacked in this order on a major surface of a sapphire substrate 101.

After completion of the crystal growth in the MOCVD apparatus, the wafer including the stacked nitride semiconductor layers was taken out from the MOCVD apparatus and subjected to heat treatment for activating the p-type layers. Specifically, the wafer was introduced into the heat treatment apparatus and heat-treated at a high temperature of 900° C. for 5 minutes. The atmosphere for the heat treatment was a nitrogen/oxygen mixture gas containing 3% oxygen.

After completion of the heat treatment for activating the p-type layers in the wafer, a p-side reflective electrode was formed. Specifically, the wafer was introduced into the evaporation apparatus, and contact electrode layer 201 of a thin Pd film was formed on p-type GaN contact layer 110 as shown in FIG. 2. Here, since the transmittance of Pd electrode layer 201 is required to be 75% or more in order to suppress the light absorption thereof, the thickness of the Pd electrode layer was set to 2.5 nm. Then, an Al mirror electrode layer 202 of 500 nm thickness for reflecting light emitted from emission layer 107 was formed on thin-film Pd contact electrode layer 201. This mirror electrode layer has its reflectance of 75% or more for light of the wavelength emitted from the emission layer, and ultraviolet light emitted toward the p-layer side from the emission layer is reflected toward the n-side transparent electrode layer side so as to contribute to improvement in the efficiency of taking out light from the light-emitting device.

Mirror electrode 202 as above was bonded to a support substrate 204 by using an adhesion layer 203. In this Example 1, a conductive polyimide resin containing Ag particles and having resistance properties against ultraviolet of 245-275 nm wavelength was used for adhesion layer 203. A Cu—W plate having electric conductivity and high heat conductivity was used as support substrate 204. The conductive polyimide resin containing Ag particles was applied to the Al mirror electrode layer and the Cu—W plate and then hardened at 450° C. thereby to bond the wafer and the Cu—W plate. Incidentally, a conductive resin containing epoxy or the like may also be used as the adhesive agent instead of the polyimide.

Figure 3:
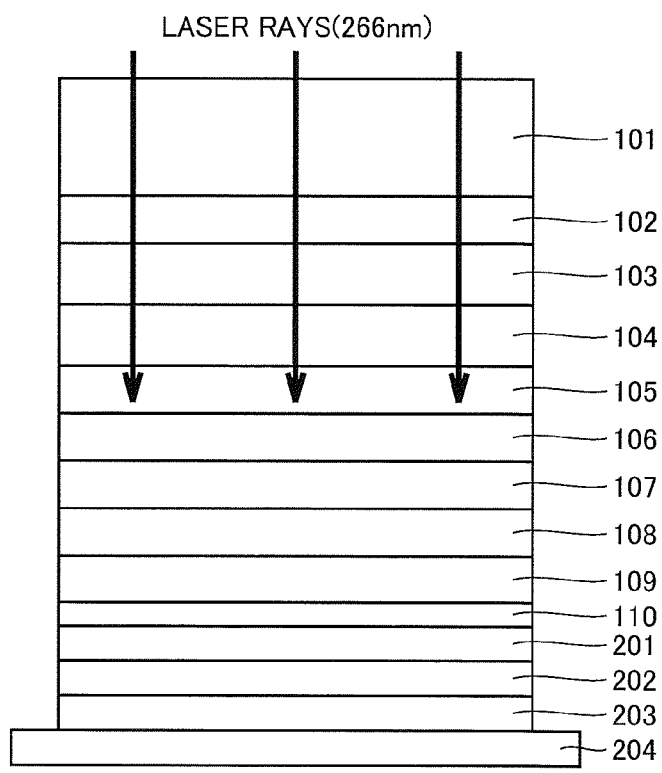
FIG. 3 is a schematic cross-sectional view showing a process stage for removing by laser the sapphire substrate and some other layers from the stacked-layer structure of FIG. 2.

Sapphire substrate 101 was removed from the wafer including bonded support substrate 204. This removal of the substrate was carried out using the laser lift-off method. As shown in FIG. 3, laser rays of 266 nm wavelength were directed into the wafer from the sapphire substrate 101 side. The laser rays were absorbed by $Al_{0.22}Ga_{0.78}N/AlN$ superlattice layer 105. The reason for this is that $Al_{0.22}Ga_{0.78}N/AlN$ has an absorption function in the vicinity of the wavelength of 266 nm. The energy of the laser rays absorbed by superlattice layer 105 was converted into heat energy, and the superlattice layer was thermally decomposed. As a result, a part including sapphire substrate 101 to AlGaN layer 104 was separated from the other part including n-type AlGaN contact layer 106 to Cu—W support substrate 204.

As shown in FIG. 4, residual substances originated from AlGnN/AlN superlatice layer 105 decomposed by the laser irradiation were attached to the removal surface where the substrate was removed by the laser irradiation, and therefore cleaning was performed on the removal surface. Specifically, the wafer was immersed for 3 minutes in a solution prepared by mixing hydrochloric acid and water at a ratio of 1:1. Thereafter water washing and drying were carried out, and the surface layer of n-type AlGaN contact layer 106 was removed by a thickness of about 0.5 μm by dry etching. This is to expose a clean surface of n-type AlGaN contact layer 106. Further, the properties of the surface of n-type AlGaN contact layer 106 is modified by influence of chlorine gas used in the dry etching so that it becomes possible to easily form an ohmic contact with an MgZnO transparent electrode formed thereon. In the dry etching of n-type AlGaN contact layer 106 in this Example 1, the surface layer of about 0.50 μm thickness was removed by using $Cl_2$ as a reactive gas for about 5 minutes in the RIE apparatus.

Regarding the dry etching, an ICP (inductively-coupled plasma) apparatus can also be used other than the RIE apparatus. Further, regarding the reactive gas used for etching, it is also possible to use a reactive gas containing $BCl_3$, $SiCl_4$ or the like, other than $Cl_2$. While the depth of etching may be more or less than 0.50 μm as long as the damaged layer due to the laser lift-off can be removed, it is necessary to stop the etching within n-type AlGaN contact layer 106 in order to obtain a good ohmic contact with an MgZnO transparent electrode.

In this Example 1, an MgZnO transparent electrode layer 301 was formed on n-type AlGaN contact layer 106 without forming such a texture structure as shown in FIG. 5 to FIG. 7. Specifically, the wafer was introduced into the ECR sputtering apparatus, and oxidation treatment of the surface of the n-type AlGaN contact layer was carried out in oxygen plasma. The reason why this oxidation treatment is performed is because oxygen atoms act as donors in the n-type AlGaN contact layer and make it easy to form an ohmic contact with the MgZnO film. On the oxidation-treated surface of n-type AlGaN layer 106, MgZnO transparent conductive film 301 was deposited in oxygen plasma.

In this Example 1, as a target for sputtering there was used a sintered body of an MgO/ZnO mixture that was adjusted in advance to have an MgO composition of 55% and a ZnO composition of 45%. The reason for this is that since light emitted from the emission layer in this Example has a wavelength of 254 nm, it is necessary to form the MgZnO film having a band gap greater than the energy of the light. In this case, the MgZnO film does not absorb the light emitted from the emission layer and is transparent for the emission wavelength and thus can function as a transparent conductive film.

In other words, the band gap energy of the $Mg_xZn_{1-x}O$ film is indicated by formula 1 as mentioned above in connection with the composition ratio x of Mg and Zn, and thus E=4.96 eV can be obtained when x=0.55. This band gap energy corresponds to energy of light of 250 nm wavelength. Therefore the MgZnO film in this case transmits ultraviolet light having a wavelength longer than 250 nm and is transparent for ultraviolet light of 254 nm wavelength emitted from the emission layer. Incidentally, in this Example 1, the MgO/ZnO target was not doped with impurities and the thickness of the MgZnO film was set to 200 nm.

After the formation of the MgZnO film was finished, the wafer was taken out from the ECR sputtering apparatus, and heat treatment was performed so as to crystallize the MgZnO film. The wafer was introduced into the heat treatment apparatus and the heat treatment was carried out at 450° C. for 15 minutes in a mixed gas atmosphere of 30% oxygen and 70% nitrogen. As a result of this heat treatment, grains (crystal grains) in the MgZnO film deposited by sputtering were integrated to have the c-axis orientation. Further, this heat treatment promotes the alloying reaction for forming the ohmic contact at the interface between n-type AlGaN contact layer 106 and MgZnO layer 301 and has an effect of recombining oxygen atoms with vacancies of oxygen atom sites on the surface of the MgZnO film, whereby the MgZnO film is improved in transparency so as to have a high transmittance for the emitted ultraviolet light.

According to measurements of transmittance for ultraviolet light of 254 nm wavelength regarding the $Mg_{0.45}Zn_{0.55}O$ film deposited in the ECR sputtering apparatus, the transmittance was 72% before the heat treatment and became 86% after the heat treatment, and it was confirmed that the final transmittance was sufficient for the function of the transparent conductive film. As seen above, the heat-treated MgZnO film has both the high transmittance and high conductivity and can function as a good transparent conductive film.

An N-type pad electrode 302 was formed on heat-treated MgZnO film 301. Specifically, after a resist pattern for forming the n-type pad electrode was formed by using photolithography, the wafer was introduced into the evaporation apparatus to deposit the n-type pad electrode layer of a Ti/Al/Ti/Au multilayer film. Thereafter, the wafer was taken out from the evaporation apparatus, and the lift-off treatment was performed to form the pad electrode. After this lift-off treatment, a heat treatment at 450° C. for 3 minutes was carried out to perform alloying between the MgZnO film and the Ti/Al/Ti/Au electrode layer.

The wafer with formed n-type pad electrode 302 was divided into a plurality of chips each having a size of 1 mm×1 mm. The ultraviolet LED chip obtained by the chip division was mounted on a stem with a submount intervening therebetween, was wired on the n-side pad electrode and then was sealed with an ultraviolet transmitting resin, whereby an ultraviolet LED device was obtained.

Example 2

A nitride semiconductor ultraviolet light-emitting device formed in Example 2 was different as compared with Example 1 only in that the texture structure as shown in FIG. 5 to FIG. 7 was formed on n-type AlGaN contact layer 106.

In this Example 2, therefore, the texture structure was simultaneously formed at the time of dry etching on the surface of N-type AlGaN contact layer 106. Specifically, the removal surface of the wafer from which the sapphire substrate had been removed by laser was subjected to the hydrochloric acid treatment, the water washing and the drying similar to the case of Example 1. Thereafter, a photoresist pattern for forming the texture structure was formed by using photolithography. The wafer having the resist pattern was introduced into the RIE apparatus, and the texture structure as shown in FIG. 5 to FIG. 7 was formed by dry etching on n-type AlGaN contact layer 106. In this Example 2, each projection in the texture structure has a truncated-cone shape having a bottom surface of 250 µm diameter and a top surface of 225 µm diameter, and its height was set to 0.25 µm. As shown in FIG. 6, the truncated-cone-shaped projections were periodically formed such that the centers of the truncated cones are arranged to be positioned at apexes of regular triangles each having a lateral of 350 µm. After formation of the texture structure, MgZnO transparent electrode 301 and n-type pad electrode 302 of a Ti/Al/Ti/Au multilayer film were formed by processes similar to the case of Example 1.

Example 3

Example 3 was different as compared with Example 1 only in that MgZnO film 301 was deposited by the MBE method. Specifically, the processes up to the dry etching of n-type AlGaN contact layer 106 were carried out, similar to the case of Example 1. However the wafer taken out from the RIE apparatus was subsequently introduced into an RF (high frequency)-MBE apparatus. After the wafer was subjected to oxidizing treatment for 5 minutes in oxygen plasma, the MgZnO film was grown by supplying Mg and Zn from MBE cells. At this time, $Mg_{0.55}Zn_{0.45}O$ film 301 transparent for ultraviolet light of 254 nm wavelength emitted from the emission layer was formed by adjusting the amounts of source materials from the cells.

In the case of forming the MgZnO film by the MBE method, since the lattice constant thereof is near that of the underlying n-type AlGaN contact layer, epitaxial growth thereof occurs and it is possible to grow monocrystalline MgZnO. The monocrystalline MgZnO film has a significantly improved electron mobility and can have current diffusion effect as a transparent conductive layer, as compared with any of the amorphous one, the polycrystalline one and the polycrystalline one oriented along the c-axis. In this Example 3 also, the thickness of $Mg_{0.55}Zn_{0.45}O$ was set to 200 nm.

Comparative Example 1

In Comparative Example 1, there was formed a usual nitride semiconductor ultraviolet light-emitting device having the lateral-type structure. Specifically, in this Comparative Example 1 also, nitride semiconductor layers 102-110 were stacked on sapphire substrate 101 under the same conditions as in the case of Example 1, as shown in FIG. 1. In formation of the light-emitting device in Comparative Example 1, however, there were not provided support substrate 204 and MgZnO transparent conductive film 301 as in the case of Example 1.

Figure 8:
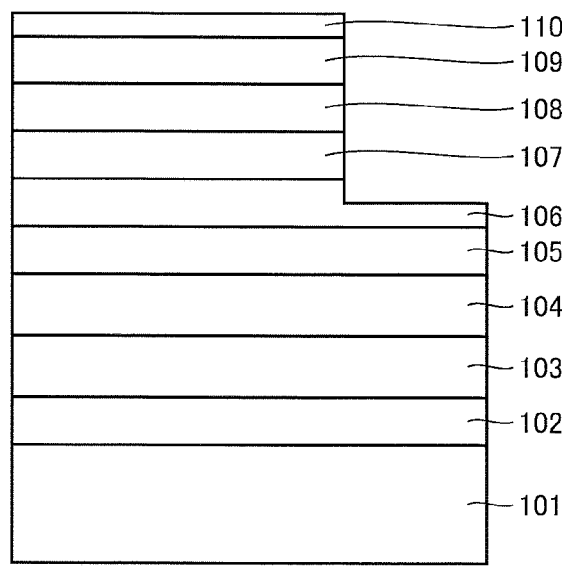
FIG. 8 is a schematic cross-sectional view of a stacked-layer structure for a nitride semiconductor ultraviolet light-emitting device according to a comparative example.

More specifically, in order to form the n-type electrode in Comparative Example 1, a resist pattern for forming a mesa part was formed on the wafer shown in FIG. 1, by using photolithography. The wafer with the formed resist pattern was introduced into the RIE apparatus, and dry etching was performed to expose a part of n-type $Al_{0.45}Ga_{0.55}N$ contact layer 106 thereby forming a mesa part as shown in FIG. 8. A resist pattern for forming the p-type electrode was then formed by again applying photolithography to the wafer having the formed mesa part. The wafer provided with this resist pattern was introduced into the sputtering apparatus, and an ITO layer was deposited in order to form a p-type contact electrode 401. Deposited ITO layer 401 was subjected to heat treatment for improving its transparency and forming an ohmic contact. Thereafter, there were formed a p-type pad electrode 402 of a Ti/Au stacked-layer film and n-type pad electrode 403 of Ti/Al/Ti/Au multilayer film (refer to FIG. 9).

Figure 9:
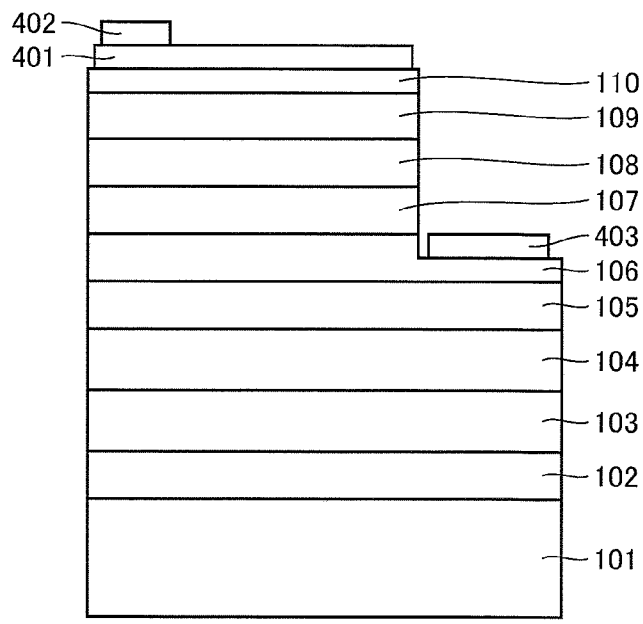
FIG. 9 is a schematic cross-sectional view of a nitride semiconductor ultraviolet light-emitting device according to a comparative example.

The wafer provided with these pad electrodes was divided by dicing into chips each having a size of 1 mm×1 mm, as shown in FIG. 9. Each ultraviolet LED chip obtained by chip division in Comparative Example 1 was mounted on a stem with a submount intervening therebetween, was wired on each pad electrode and was molded with an ultraviolet transmitting resin, whereby an ultraviolet LED device of Comparative Example 1 was obtained.

(Evaluation)

The above-described ultraviolet LED devices of Examples 1-3 and Comparative Example 1 were compared regarding their optical outputs at an electric current of 100 mA. As a result, when the optical output of Example 1 was normalized as 1.0, the optical outputs of Example 2, Example 3 and Comparative Example 1 were 1.3, 1.1 and 0.3, respectively. From this fact, it is understood that as compared with the conventional lateral-type LED device using ITO for the transparent electrode, the vertical-type LED of the present invention can have an improved high optical output by providing the reflective metal mirror on the p-type layer side and forming the MgZnO transparent conductive film on the n-type layer after removal of the sapphire substrate.

Incidentally, while in the above-described Embodiments and Examples no nitride semiconductor contains In, it goes without saying that In can be contained as desired.

According to the present invention, by providing the transparent conductive film of crystallized MgZnO having high conductivity and high transmittance on the nitride semiconductor layer, electric current is diffused in the nitride semiconductor layer, the emission layer uniformly emits light, light absorption due to the transparent conductive film is suppressed, and as a result it becomes possible to provide the nitride semiconductor ultraviolet light-emitting device having high emission intensity.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A nitride semiconductor ultraviolet light-emitting device comprising:
   at least one first conductivity-type nitride semiconductor layer, a nitride semiconductor emission layer, at least one second conductivity-type nitride semiconductor layer and a transparent conductive film of crystallized $Mg_{x1}Z_{n1-x1}O$ (0<x1<1) that can transmit 75% or more of light emitted from the emission layer, in this order on a support substrate, wherein the first conductivity-type is a p-type and the second conductivity-type is an n-type.

2. The nitride semiconductor ultraviolet light-emitting device according to claim 1, wherein the transparent conductive film comprises polycrystalline $Mg_{x1}Z_{n1-x1}O$ oriented along its c-axis.

3. The nitride semiconductor ultraviolet light-emitting device according to claim 1, wherein the transparent conductive film comprises monocrystalline $Mg_{x1}Z_{n1-x1}O$.

4. The nitride semiconductor ultraviolet light-emitting device according to claim 3, wherein the transparent conductive film of monocrystalline $Mg_{x1}Z_{n1-x1}O$ is lattice-matched with the second conductivity-type nitride semiconductor layer.

5. The nitride semiconductor ultraviolet light-emitting device according to claim 1, wherein the transparent conductive film is non-doped.

6. The nitride semiconductor ultraviolet light-emitting device according to claim 1, wherein at least one kind of elements of Al, Ga and In is added as impurities into the transparent conductive film.

7. The nitride semiconductor ultraviolet light-emitting device according to claim 1, wherein the first conductivity-type and the second conductivity-type nitride semiconductor layers are formed with p-type $Al_{x2}Ga_{1-x2-y2}In_{y2}N$ (0≤x2≤1, 0≤y2≤1, 0≤x2≤1) and n type $Al_{x3}Ga_{1-x3-y3}In_{y3}N$ (0≤x3≤1, 0≤y3≤1, 0≤x3+y3≤1), respectively.

8. The nitride semiconductor ultraviolet light-emitting device according to claim 1, wherein light emitted from the emission layer comprises a wavelength in a range of 215 nm to 365 nm.

9. The nitride semiconductor ultraviolet light-emitting device according to claim 1, wherein the emission layer comprises $Al_{x4}Ga_{1-x4-y4}In_{y4}N$ (0≤x4≤1, 0≤y4≤1, 0≤x4+y4≤1).

10. The nitride semiconductor ultraviolet light-emitting device according to claim 1, wherein the support substrate and the first conductivity nitride semiconductor layer are electrically connected to each other with a highly-reflective film intervening therebetween which can reflect 75% or more of light having a wavelength emitted from the emission layer.

* * * * *